(12) United States Patent
Luke et al.

(10) Patent No.: US 8,552,429 B2
(45) Date of Patent: Oct. 8, 2013

(54) PROXIMITY CHARGE SENSING FOR SEMICONDUCTOR DETECTORS

(75) Inventors: Paul N. Luke, Castro Valley, CA (US); Craig S. Tindall, San Ramon, CA (US); Mark Amman, San Francisco, CA (US)

(73) Assignee: The Regents of the University of California, Oakland, CA (US)

( * ) Notice: Subject to any disclaimer, the term of this patent is extended or adjusted under 35 U.S.C. 154(b) by 546 days.

(21) Appl. No.: 12/604,173

(22) Filed: Oct. 22, 2009

(65) Prior Publication Data

US 2010/0102844 A1   Apr. 29, 2010

Related U.S. Application Data

(60) Provisional application No. 61/107,907, filed on Oct. 23, 2008.

(51) Int. Cl.
*H01L 29/04* (2006.01)

(52) U.S. Cl.
USPC ............... 257/52; 438/56; 250/370.09

(58) Field of Classification Search
USPC ............... 257/52–56; 438/56; 250/370.09
See application file for complete search history.

(56) References Cited

U.S. PATENT DOCUMENTS

| | | | | |
|---|---|---|---|---|
| 6,333,504 | B1 * | 12/2001 | Lingren et al. | 250/370.01 |
| 7,466,161 | B2 * | 12/2008 | Gardner et al. | 324/760.01 |
| 8,063,378 | B2 * | 11/2011 | Bolotnikov et al. | 250/370.01 |
| 2001/0035497 | A1 * | 11/2001 | Montemont et al. | 250/370.01 |
| 2005/0001213 | A1 * | 1/2005 | Tindall et al. | 257/52 |

* cited by examiner

*Primary Examiner* — Shaun Campbell
(74) *Attorney, Agent, or Firm* — Fulbright & Jaworski LLP

(57) ABSTRACT

A non-contact charge sensor includes a semiconductor detector having a first surface and an opposing second surface. The detector includes a high resistivity electrode layer on the first surface and a low resistivity electrode on the high resistivity electrode layer. A portion of the low resistivity first surface electrode is deleted to expose the high resistivity electrode layer in a portion of the area. A low resistivity electrode layer is disposed on the second surface of the semiconductor detector. A voltage applied between the first surface low resistivity electrode and the second surface low resistivity electrode causes a free charge to drift toward the first or second surface according to a polarity of the free charge and the voltage. A charge sensitive preamplifier coupled to a non-contact electrode disposed at a distance from the exposed high resistivity electrode layer outputs a signal in response to movement of free charge within the detector.

13 Claims, 4 Drawing Sheets

PROXIMITY CHARGE SENSING FOR SEMICONDUCTOR DETECTORS

CROSS-REFERENCE TO RELATED APPLICATIONS

This application claims priority to U.S. Patent Provisional Application 61/107,907, filed Oct. 23, 2008, which is incorporated by reference herein.

STATEMENT OF GOVERNMENTAL SUPPORT

This invention was made in the course of or under prime contract No. DE-AC02-05CH11231 between the Department of Energy and the University of California. The government has certain rights in this invention.

TECHNICAL FIELD

This disclosure relates to semiconductor electronics, and in particular, to non-contact proximity charge sensing using semiconductor detectors.

BACKGROUND

Semiconductor radiation detectors are routinely used for the detection, imaging and spectroscopy of gamma-ray, x-ray, and charged particles. In basic form, a detector is comprised of a semiconductor crystal with two or more electrodes formed on its surfaces. Besides allowing for the application of bias voltage, one or more of the electrodes on a detector also serves as a readout electrode. Charge carriers drifting across the detector induce a charge signal on the electrode, which can then be measured by a charge-sensitive amplifier connected to the electrode. Spatial resolution of the detected charge can be obtained by providing multiple electrodes, each with a charge-sensitive amplifier.

Pixel and strip detectors are widely used to provide particle tracking and imaging capability for a wide variety of applications, including high-energy and nuclear physics, astronomy, medical imaging, and nuclear materials detection. Typically these detectors are fabricated by segmenting the electrode on one or both sides of the device. Electrical connections are then needed to connect each electrode element to the readout electronics. This is conventionally accomplished using wire bonding or bump bonding techniques. There are considerable complexities and costs associated with these interconnect technologies, especially for bump bonding. In addition, these bonding techniques may be difficult to apply for some semiconductor materials due to the poor mechanical strength of the materials or their inability to withstand high temperature processing.

SUMMARY

A non-contact charge sensor includes a semiconductor detector having a first surface and an opposing second surface. The detector includes a high resistivity first surface electrode layer disposed on the first surface and low resistivity first surface electrode disposed on the high resistivity first surface electrode layer, wherein an area portion of the low resistivity first surface electrode is deleted to expose the high resistivity electrode layer in the inner area. A low resistivity second surface electrode layer is disposed on the second surface of the semiconductor detector, wherein a voltage applied between the first surface low resistivity electrode disposed on the high resistivity electrode layer and the second surface low resistivity electrode causes a free charge to drift toward the high resistivity electrode on the first surface or the low resistivity electrode on the second surface according to a polarity of the free charge and the polarity of the applied voltage. At least one non-contact electrode is disposed at a selected distance apart from the exposed high resistivity first surface electrode layer, and a charge sensitive preamplifier coupled to the non-contact electrode outputs a signal in response to the free charge within the detector arriving at the high resistivity first surface electrode.

The foregoing has outlined rather broadly the features and technical advantages of the present disclosure in order that the detailed description of the embodiments that follow may be better understood. Additional features and advantages of the embodiments will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present embodiments of the disclosure.

DESCRIPTION OF THE FIGURES

For a more complete understanding of the present disclosure, reference is now made to the following descriptions taken in conjunction with the accompanying drawings.

DETAILED DESCRIPTION

In general, the readout electrodes of a detector are formed on the detector itself. However, charge can be induced on any electrode, even if the electrode is not physically in contact with the semiconductor. Such proximity charge sensing effects can be utilized to achieve a variety of advantages in applications involving semiconductor detectors.

A non-contact readout technique could eliminate the need for hard-wired interconnections and avoid much of the complexity and cost. It would also simplify detector fabrication since it is not necessary to produce segmented electrode structures on the detectors themselves. Different segmentation schemes can be effectively implemented on the same detector by simply changing the geometry of the proximity readout electrodes.

The charge signal induced at an electrode due to the movement of a charge carrier in a detector is given by the Shockley-Ramo theorem [W. Shockley, "Currents to conductors induced by a moving point charge," J. Appl. Phys., vol. 9, pp. 635-636 (1938), S. Ramo, "Current induced by electron motion," Proc. IRE, Vol. 27. pp. 584-585 (1939)]. and it can be calculated using the weighting potential method:

$$dQ_{ind} = -QdV_w$$

where $Q_{ind}$ is the induced charge on the electrode, Q is the charge of the carriers, $V_W$ is the weighting potential of the electrode. $V_W$ is a dimensionless quantity that can be calculated using Poisson's equation by setting the space charge to zero and the potential of the electrode to unity with all other electrodes at zero potential. The dielectric of the detector material and of the surrounding materials must be included in the calculation to provide valid results. This method of induced signal calculation applies to any conductive electrode, provided that the electrode is maintained at a fixed potential (i.e., not floating).

Figure 1:
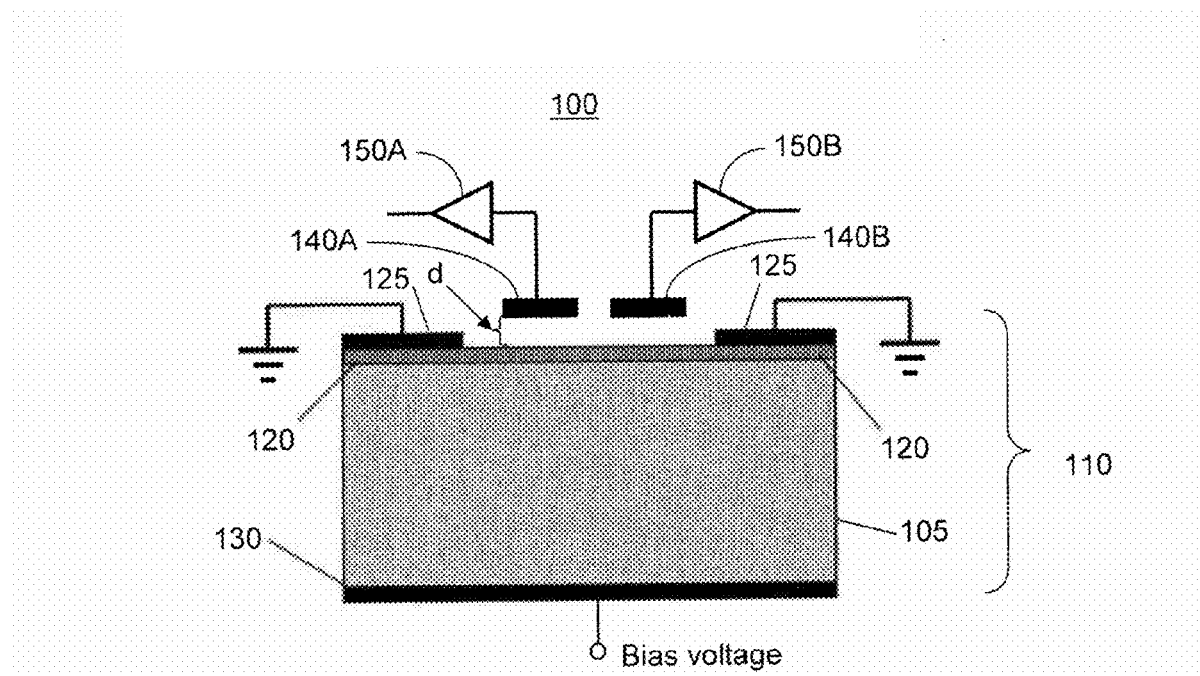
FIG. 1 shows a non-contact proximity charge sensor according to an embodiment of the disclosure.

FIG. 1 depicts a configuration to realize a non-contact charge sensor 100 using proximity charge sensing. The charge sensor 100 includes a simple planar device semiconductor detector 110, including a semiconductor 105 of a selected thickness and two full-area electrode contacts 120 and 130, deposited on the opposing planar surfaces. An additional electrode 125 is formed on electrode contact 120 and will be discussed in more detail below. One or more proximity readout electrodes, e.g., 140A, 140B, are placed above the detector surface, separated by a gap d from the electrode contact 120. The readout electrodes 140A, 140B are coupled to charge-sensitive preamplifiers 150A, 150B, respectively, which are components of readout electronic circuitry (not shown, except for preamplifiers 150A, 150B). When a bias voltage is applied between contacts 120 and 130, a free charge generated when ionizing radiation deposits energy in the device 110 will drift toward one of the electrodes 120 or 130, depending on the charge polarity and the voltage bias polarity. The detector contact 120 adjacent to the proximity electrodes (e.g., on the top planar surface, as seen in FIG. 1) is formed to satisfy two competing objectives. First, it should be transparent to electric fields at the time scale comparable to the charge collection and pulse processing time of readout electronic circuitry, so that a moving free charge inside the detector can produce an electric field above the surface of the electrode 120, and therefore should not be so conductive as to shield the electric field of the moving free charge in the gap d, but is able to induce a signal on the proximity electrodes 140. At the same time, it has to allow the free charge signal carriers and leakage current collected at the contact 125 to dissipate without excessive charge build up, which could distort the electric field in the detector. These objectives can be satisfied by using a contact 120 with an appropriate sheet resistivity. Additionally, the resistive contact 120 has to be a good blocking (i.e., Schottky or p-n junction) contact as well so that an adequate bias can be applied to the detector without excessive leakage current.

For detectors 110 with low leakage currents, such as liquid-nitrogen-cooled Ge detectors, which typically have leakage currents <<1 nanoampere (nA), an electrode 120 with sheet resistivity of ~$10^9$ ohm/sq would be appropriate. The dissipation time for carriers collected at the electrode 120 will be roughly equal to the RC time constant associated with the resistance of the electrode and the capacitance of the detector. For typical detector capacitances of ~10 picofarads (pF) and resistance ~$10^9$ ohm, the time constant would be ~10 milliseconds (ms), which is much longer than the readout electronic circuitry pulse processing time for such detectors (e.g., several microseconds (μs)).

Detectors 110 with higher leakage currents, such as room-temperature-operated Si detectors and some compound semiconductor detectors (e.g., CdTe, CdZnTe, GaAs), may have a lower resistivity electrode 120 to avoid charge buildup and distortion of the electric field. The lower resistivity would result in a smaller charge dissipation time constant, and a correspondingly shorter pulse shaping time would be required. This is not a major issue, since a short shaping time (discussed below) is normally desired in such cases to reduce the noise contribution of high leakage currents. The tradeoffs in the selection of sheet resistivity of the contact 120 are similar to the choice of the resistance of the feedback resistor in a charge-sensitive preamplifier 150 when DC-coupled to a detector. The amorphous Si and amorphous Ge contacts 120 that have been developed for Si and Ge detectors can be tailored to have a wide range of resistivities.

In an exemplary embodiment, a 5 millimeter (mm) thick Si(Li) detector 110 to demonstrate the non-contact readout scheme with proximity electrodes was fabricated. The detector 110 and readout geometry are similar to that shown in FIG. 1. The original Li-diffused contact was removed after Li drifting and replaced with an amorphous-Si (a-Si) contact 120 formed by RF sputtering [I. D. Hau, C. Tindall, P. N. Luke, "New contact development for Si(Li) orthogonal-strip detectors," Nucl. Instr. Meth., vol. A505, no.1-2, pp. 148-154 (2003)]. The a-Si contact 120 has a sheet resistivity of ~10 ohm/sq. An aluminum electrode 125 was evaporated over the a-Si contact 120 except for a 10 mm×10 mm area in the center to expose the contact 120. The Al electrode 125 serves as a conductive ring to allow the application of bias voltage to the a-Si contact. The Al electrode 125 can be formed in another pattern, i.e., other than a ring (e.g., a mesh or thin strips), and may be formed using any suitable conductive material. In either case, the electrode 125 serves to form a contact between the a-Si contact 120 and external circuitry. For this measurement, the a-Si contact 120 was held at ground potential and a negative high-voltage bias was applied to the bottom contact 130, which is a standard Au surface barrier.

A circuit board (not shown) with two conductive pads was held over the 10 mm×10 mm opening of the exposed portion of the contact 120 to serve as two proximity electrodes (e.g., 140A and 140B). Each pad electrode has dimensions of 2.9 mm×6 mm, and they are separated by a gap of 0.75 mm. The gap d between the pads and the a-Si contact 120 was about 60 μm. Each electrode 140A, 140B, was connected to a charge-sensitive preamplifier 150A, 150B, respectively, followed by a time shaping amplifier (not shown). The time shaping amplifier has time-frequency pass-band characteristics to provide noise reduction filtering. The detector 100 was operated at room temperature.

Figure 2:
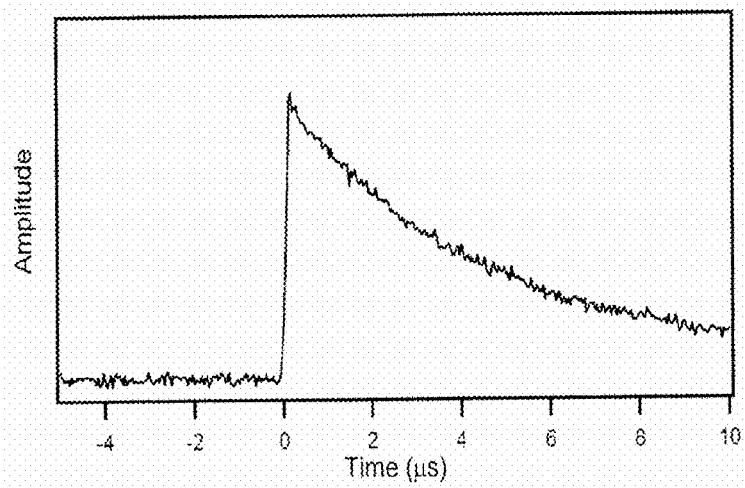
FIG. 2 shows the signal output from a charge sensitive preamplifier of a non-contact proximity charge sensor according to an embodiment of the disclosure.

FIG. 2 shows the signal output from one of the charge sensitive preamplifiers 150 coupled to a corresponding electrode 140 (e.g., 140A) in response to an alpha particle incident from a source below the contact 130 of the semiconductor detector 110. The sharp rise of the signal corresponds to the rapid collection, towards the contact 120, of the drifting free carriers across the thickness of the semiconductor 105, which in this example would be negative charge attracted to the relative positive polarity of contact 120. The following decay is due to the dissipation of the carriers away from the collection point (at which the carriers arrive) in contact 120 towards the electrode 125. The decay time is approximately 6 μs, which is roughly as expected based on the sheet resistivity of the a-Si contact 120.

Figure 3:
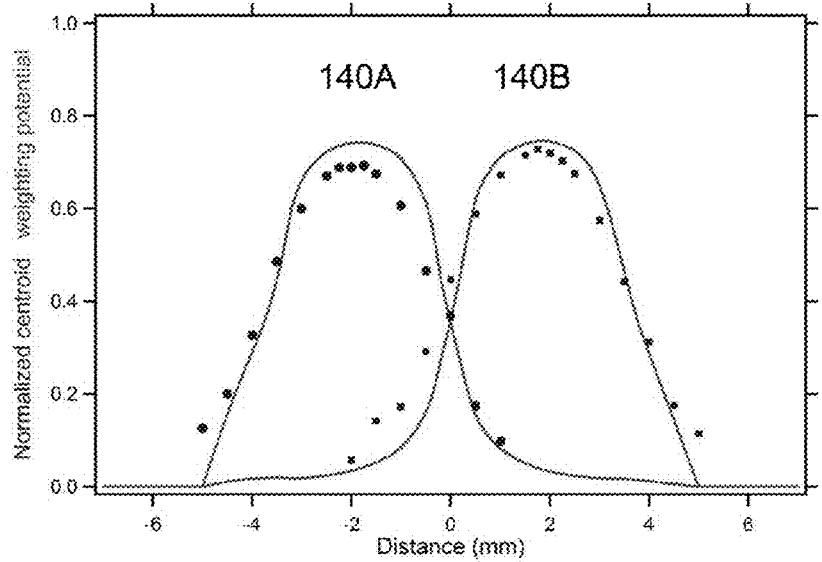
FIG. 3 shows the spatial response of a pair of adjacent non-contact proximity charge sensors according to an embodiment of the disclosure.

The detector was tested by scanning a collimated alpha particle source (not shown) along the bottom contact 130 to pass across the two non contact proximity electrodes 140A, 140B. A pulse height spectrum was acquired at discrete source locations for each proximity electrode 140A and 140B. A shaping time of 0.5 μs is was used for this measurement. FIG. 3 shows how the centroid of the alpha particle peak varies across the detector. The centroids were normalized to the full-energy peak that would be obtained if the charge carriers were collected to an electrode on the detector surface. As expected, the peak centroid is at a maximum at the middle of each electrode 140A and 140B, and decreases towards the edges. The data matches the calculated weighting potentials of the two electrodes 140A, 140B. The good agreement indicates that the electric field in the detector 110 was not distorted, meaning that the resistivity of the a-Si contact was low enough to prevent significant charging due to the bulk leakage current of the detector.

The experimental results demonstrate the proximity readout technique, and show that position-sensitive readout can be achieved using multiple proximity electrodes 140. In addition, position resolution can be greatly increased beyond that of the electrode pitch by interpolation based on the ratio of signal amplitudes obtained from adjacent proximity electrodes for each event. The amplitude ratio is given by the ratio of the weighting potentials of the electrodes 140 at the location of charge collection on the surface of the detector.

Figure 4:
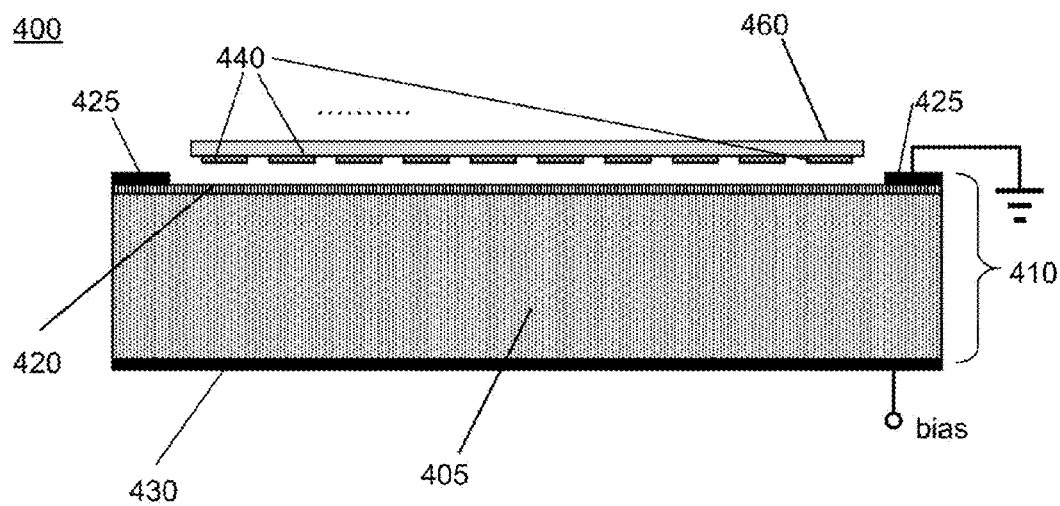
FIG. 4 shows a multi-pixel/strip embodiment of a non-contact proximity charge sensors in accordance with the disclosure.

FIG. 4 shows a pixel/strip charge sensor 400 described above, having multiple strip electrodes 440 on a readout board 460, which may contain charge sensitive pre-amplifiers (not shown, but equivalent to charge sensitive pre-amplifiers 150) coupled to respective electrodes 440. Each strip electrode 440 is coupled to a charge-sensitive preamplifier (not shown, but equivalent to preamplifiers 150A, 150B, as shown in FIG. 1), which may be incorporated, for example, in an ASIC on the readout board 460. In an embodiment, the ASIC chip can have readout pads integrated on-chip, replacing the readout board. In one embodiment, the electrodes 440 may be configured as strips to provide a substantially one dimensional imaging of charge detection. In another embodiment, the electrode 440 may be patterned as a two dimensional array to provide a two-dimensional image of charge detection. The array of electrodes 440 is spaced a small distance above a high resistivity contact 420 of a detector device 410, substantially like the detector 110 of FIG. 1. The detector 410 also includes a peripheral contact electrode 425 to drain charge arriving at the contact 420 from within a semiconductor 405. The charge drifts toward the contact 420 due to the bias field of a voltage applied between the electrode 425 and an electrode 430 on the opposite side of the semiconductor detector 410.

Figure 5:
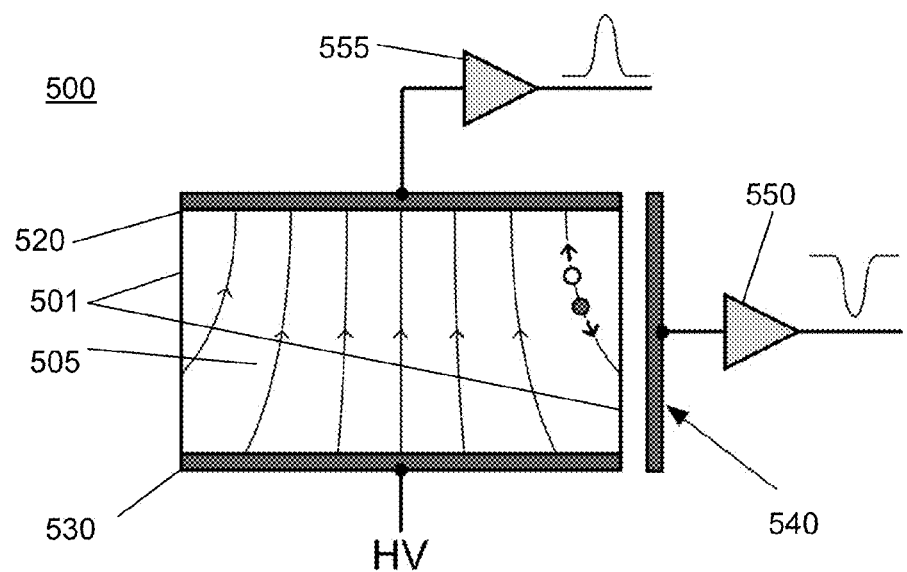
FIG. 5 shows detector side non-contact proximity charge sensor in accordance with accordance the disclosure.

Large-volume detectors (e.g., detector 110 of FIG. 1), such as Ge detectors and CdZnTe detectors used for gamma-ray spectroscopy, and Si(Li) detectors for x-ray spectroscopy, can have detector thicknesses of up to several cm. FIG. 5 is a representation of a large volume detector 500. The un-contacted side surfaces 501, sometimes referred to as the intrinsic surfaces, can charge up and produce so-called surface channels. The bending of the internal field as a result of these surface channels can cause signal charges generated inside the detector to be collected at the side surface 501 instead of at the detector contacts 520 and 530, leading to incomplete charge collection and reduced signal amplitudes. This generates additional background in the spectra obtained with the detector 500.

Since the side surfaces 501 of detectors are of necessity high resistivity, a proximity electrode 540 placed close to the detector surface will produce an induced signal due to the collection of carriers within the detector 500, as shown in FIG. 5. For detectors that have negligible trapping of carriers in the bulk (e.g., Ge detectors), there will be no net charge induced at the proximity electrode 540 as long as the carriers are fully collected at the detector's contacts. However, if some of the carriers are collected at the side surface 501, a net induced signal is obtained. The carriers collected at the side surface 501 will slowly dissipate through surface conduction, and this will cause the induced charge signal to return to zero. This process, however, usually occurs at a much longer time scale than the typical shaping time so that effectively a net charge signal is observed at the proximity electrode 540. Therefore, a non-zero net induced charge signal at the proximity electrode 540 can be used to indicate when incomplete charge collection occurs. The proximity electrode 540 is coupled to a charge-sensitive preamplifier 550. The signal from the preamplifier 550 can then be used in anti-coincidence with the detector signal output from a preamplifier 555 coupled to the electrode 520 to reject surface collection events and reduce spectral background. Alternatively, a processor may be used to correct for an incomplete charge accumulation at the electrode 520 by comparing the output from the electrode 520 and the non-contact proximity electrode 540. The correction may be a post-processing operation.

Figure 6:
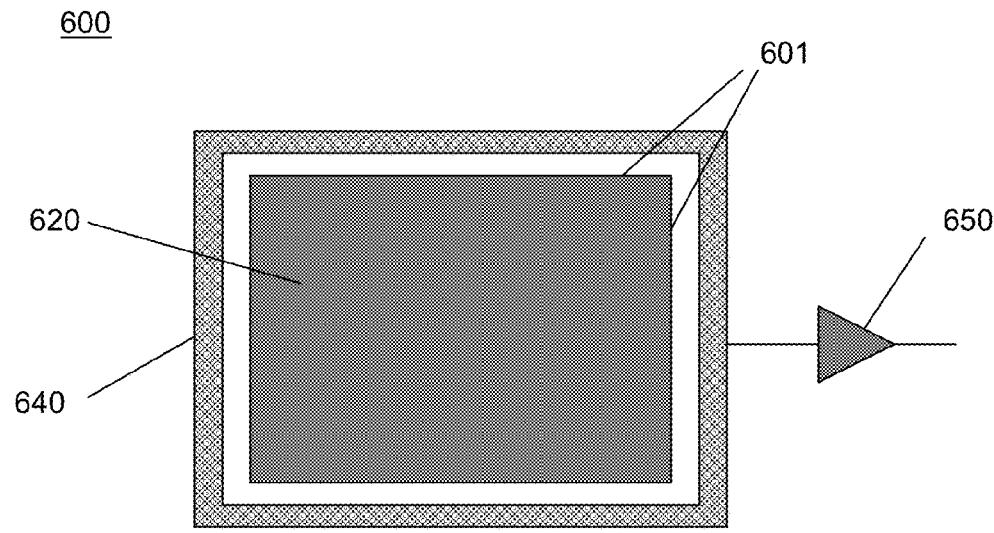
FIG. 6 shows a semiconductor detector surrounded on four sides by a non-contact proximity charge sensor in accordance with the disclosure.
Figure 7:
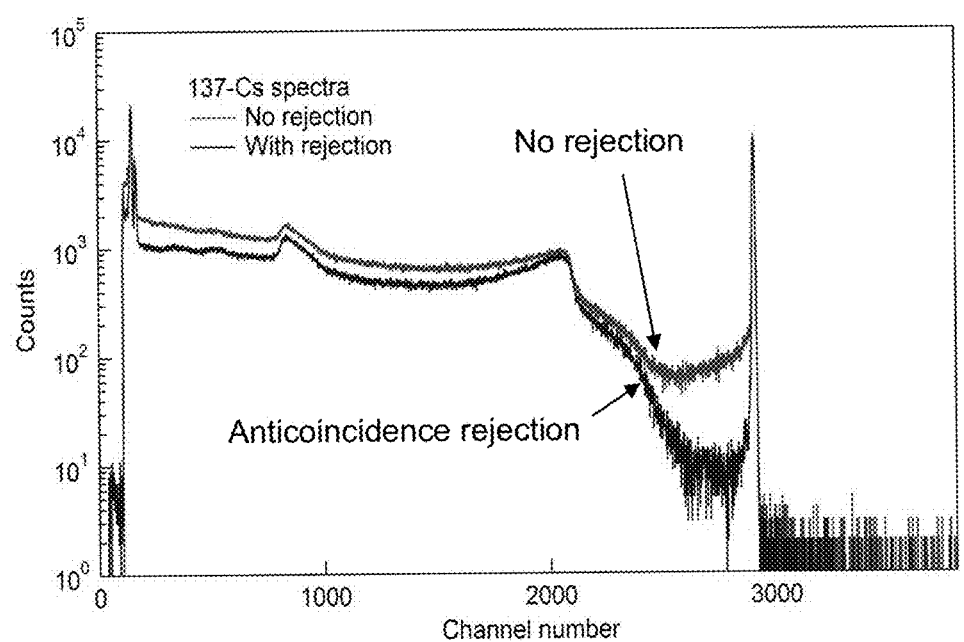
FIG. 7 shows the reduction in background noise signal achieved by using signals from a non-contact proximity side electrode charge sensor in anticoincidence with the detector signals.

As an example, as graphically represented in FIG. 6, measurements were performed using a small planar Ge detector 600 (18 mm×18 mm×10 mm) having a top electrode 620 and a corresponding bottom electrode (not shown) with a proximity electrode 640 wrapped around the detector 600 close to the side surfaces 601, separated by a gap. A charge-sensitive preamplifier 650 outputs a signal corresponding to the charge arriving at the side surfaces 601 and detected by the proximity electrode 640. FIG. 7 shows the reduction in background achieved by using signals from the proximity electrode 640 in anticoincidence with the detector signals from electrode 620. In one embodiment, the charge sensing obtained from the side surface electrodes 640 may be used in post-processing to correct for incomplete charge accumulation detected at the top electrode 620.

An apparatus and method to sense charge collection in semiconductor detectors using proximity electrodes is disclosed. The application of this apparatus for position-sensitive readout and background rejection has been demonstrated. An advantage of embodiments of the disclosure is that by avoiding the need for hard-wired electrical connections between readout electronics and detectors, the detector fabrication and assembly can be greatly simplified. The proximity readout scheme also allows a simple method of position interpolation using the ratios of signal amplitudes from adjacent proximity electrodes.

By placing proximity electrodes near the side surfaces of conventional detectors, events with incomplete charge collection due to side surface charge collection can be sensed and rejected, resulting in the lowering of spectral background. It should also be possible to use the proximity electrode signals to determine the amount of charge loss and correct for it in post processing. Similarly, this technique could in principle be applied to sense and correct for bulk carrier trapping as well.

Another advantage of the proximity readout scheme is the ability to perform signal interpolation to achieve a much finer position resolution than that given by the pitch of the readout electrodes. The charge induced on a proximity electrode is determined by the weighting potential at the resistive contact at the point where the carriers are collected. By taking the ratios of the amplitudes of the induced signals on the readout electrodes (e.g., 140, 440), the location of the collection point can be precisely and uniquely determined.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the embodiments of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A non-contact charge sensor comprising:
a semiconductor detector having a first surface and an opposing second surface, the detector comprising:
a substrate having the first surface and the opposing second surface;
a high resistivity first surface electrode layer disposed on the first surface;
a low resistivity first surface electrode disposed on the high resistivity first surface electrode layer, wherein an area portion of the low resistivity first surface electrode is removed to expose a portion of the high resistivity electrode layer;
a low resistivity second surface electrode layer disposed on the second surface of the semiconductor detector, wherein a voltage applied between the first surface low resistivity electrode and the second surface low resistivity electrode causes a free charge to drift toward the high resistivity electrode on the first surface or the low resistivity electrode on the second surface according to a polarity of the free charge and the polarity of the applied voltage;
at least one non-contact electrode disposed at a selected distance apart from the exposed portion of the high resistivity first surface electrode layer, the at least one non-contact electrode configured to have a signal induced in it in response to the movement of the free charge within the semiconductor detector, in which the high resistivity first surface electrode layer induces the signal on the non-contact electrode; and
a charge sensitive preamplifier coupled to the non-contact electrode to output a signal in response to the movement of the free charge within the detector.

2. The sensor of claim 1, wherein the high resistivity first surface electrode layer is at least one of amorphous silicon and amorphous germanium.

3. The sensor of claim 2, wherein the high resistivity first surface electrode layer is amorphous germanium layer having a sheet resistivity of approximately 109 ohms/square at liquid nitrogen temperatures.

4. The sensor of claim 2, wherein the high resistivity first surface electrode layer is amorphous silicon having a sheet resistivity of approximately 107 ohms/square at room temperature.

5. The sensor of claim 1, wherein
the non-contact electrode is smaller than the exposed area;
the signal is dependent on the selected distance between the non-contact electrode and the high resistivity first surface electrode; and
the signal amplitude is dependent on a lateral distance between the center of the non-contact electrode and a point on the first surface at which the charge arrives.

6. The sensor of claim 5, further comprising:
the at least one non-contact electrode being a plurality of non-contact electrodes; and
an enhanced spatial resolution of the point on the first surface at which the charge arrives obtained by an interpolation of the signal amplitude provided by each of the plurality of non-contact electrodes.

7. A method of non-contact charge sensing comprising:
providing a semiconductor detector of having a first surface and an opposing second surface of a substrate;
disposing a high resistivity first surface electrode layer on the first surface of the substrate;
disposing a low resistivity first surface electrode on a portion of the high resistivity first surface electrode layer, wherein an area portion of the high resistivity electrode layer is exposed;
disposing a low resistivity second surface electrode layer on the second surface of the semiconductor detector;
applying a voltage between the first surface low resistivity electrode and the second surface low resistivity electrode to cause a free charge to drift toward the high resistivity electrode layer on the first surface or the low resistivity electrode on the second surface according to a polarity of the free charge and the polarity of the applied voltage;
providing at least one non-contact electrode disposed at a selected distance apart from the exposed high resistivity first surface electrode layer, the at least one non-contact electrode configured to have a signal induced in it in response to the movement of the free charge within the semiconductor detector, in which the high resistivity first surface electrode layer induces the signal on the non-contact electrode; and
providing a charge sensitive preamplifier coupled to the non-contact electrode to output a signal in response to the free charge within the detector arriving at the high resistivity first surface electrode.

8. The method of claim 7, wherein signal amplitude is dependent on a lateral distance between the center of the non-contact electrode and a point on the first surface at which the charge arrives.

9. The method of claim 8, wherein the at least one non-contact electrode is a plurality of non-contact electrodes, the method further comprising:
interpolating the signal amplitude provided by each of the plurality of non-contact electrodes to enhance a spatial resolution of the point on the first surface at which the free charge arrives.

10. A non-contact charge sensor having a reduced spectral background, comprising:

a semiconductor detector having a first surface and an opposing second surface and sides, the detector comprising:
  a first electrode on the first surface;
  a second electrode on the second surface;
  a voltage applied between the first electrode and the second electrode to cause a free charge to drift toward the first or second electrode according to a polarity of the free charge and the polarity of the applied voltage;
  a first charge sensitive preamplifier coupled to the first electrode to output a signal in response to a movement of the free charge within the detector;
  at least one non-contact electrode spaced apart from the sides of the detector between the first and second surfaces configured to capture signal charges generated inside the detector at one of the sides of the detector;
  a second charge-sensitive preamplifier coupled to the non-contact electrode to output a signal in response to the free charge within the detector arriving at the sides of the detector; and
  an anticoincidence processor to correct for an incomplete charge accumulation at the first electrode by comparing the output from the first charge-sensitive preamplifier to the output from the second charge-sensitive preamplifier.

11. A method of non-contact charge sensor having a reduced spectral background, comprising:
  providing a semiconductor detector having a first surface and an opposing second surface;
  providing a first electrode on the first surface;
  providing a second electrode on the second surface;
  applying a voltage between the first electrode and the second electrode to cause a free charge to drift toward the first or the second electrode according to a polarity of the free charge and the polarity of the applied voltage;
  providing a first charge sensitive preamplifier coupled to the first electrode to output a signal in response to a movement of the free charge within the detector;
  providing at least one non-contact electrode spaced apart from and opposite the sides between the first and second surfaces of the detector, the non-contact electrode configured to capture signal charges generated inside the detector at one of the sides of the detector;
  providing a second charge-sensitive preamplifier coupled to the non-contact electrode to output a signal in response to the free charge within the detector arriving at the sides of the detector; and
  providing an anticoincidence processor to correct for an incomplete charge accumulation at the first electrode by comparing the output from the first charge-sensitive preamplifier to the output from the second charge-sensitive preamplifier.

12. A non-contact charge sensor having a reduced spectral background, comprising:
  a semiconductor detector having a first surface and an opposing second surface and sides between the first and second surfaces, the detector comprising:
    a first electrode on the first surface;
    a second electrode on the second surface;
    a voltage applied between the first electrode and the second electrode to cause a free charge to drift toward the first or second electrode according to a polarity of the free charge and the polarity of the applied voltage;
    at least one non-contact electrode spaced apart from and opposite the sides of the detector, the non-contact electrode configured to capture signal charges generated inside the detector at one of the sides of the detector; and
    a processor to correct for an incomplete charge accumulation at the first electrode by comparing the output from the first electrode and the non-contact electrode.

13. A method of non-contact charge sensor having a reduced spectral background, comprising:
  providing a semiconductor detector having a first surface and an opposing second surface;
  providing a first electrode on the first surface;
  providing a second electrode on the second surface;
  applying a voltage between the first electrode and the second electrode to cause a free charge to drift toward the first or the second electrode according a polarity of the free charge and the polarity of the applied voltage;
  providing at least one non-contact electrode spaced apart from and opposite the sides of the detector, the non-contact electrode configured to capture signal charges generated inside the detector at one of the sides of the detector; and
  providing an anticoincidence processor to correct for an incomplete charge accumulation at the first electrode by comparing the output from the first electrode to the output from the non-contact electrode.

\* \* \* \* \*